United States Patent

Yoshida

[11] Patent Number: 5,891,241
[45] Date of Patent: Apr. 6, 1999

[54] SYNTHESIS OF DIAMOND SINGLE CRYSTAL FROM HYDROGENATED AMORPHOUS CARBON

[75] Inventor: Hiroshi Yoshida, Sendai, Japan

[73] Assignee: Research Development Corporation of Japan, Japan

[21] Appl. No.: 671,946

[22] Filed: Jun. 28, 1996

[30] Foreign Application Priority Data

Jul. 2, 1995 [JP] Japan .................................. 7-188030

[51] Int. Cl.$^6$ ............................ C30B 1/02; C30B 29/04; C30B 30/00

[52] U.S. Cl. .............................. 117/8; 117/929; 117/108; 423/446

[58] Field of Search ............................ 117/4, 8, 88, 103, 117/929; 423/446

[56] References Cited

U.S. PATENT DOCUMENTS

| | | | |
|---|---|---|---|
| 4,309,225 | 1/1982 | Fan et al. | 438/72 |
| 5,154,945 | 10/1992 | Baldwin et al. | 427/596 |
| 5,373,803 | 12/1994 | Noguchi et al. | 117/8 |
| 5,643,641 | 7/1997 | Turchan et al. | 427/595 |

*Primary Examiner*—Benjamin Utech
*Assistant Examiner*—Donald L. Champagne
*Attorney, Agent, or Firm*—Webb Ziesenheim Bruening Logsdon Orkin & Hanson, P.C.

[57] ABSTRACT

Hydrogenated amorphous carbon mainly composed of $sp^3$ structure is prepared by adding hydrogen to carbon or decomposing hydrogenated carbon gas, and then rapidly cooling the mixed or decomposed gas on a substrate. The hydrogenated amorphous carbon is irradiated with X rays to excite electrons on the 1s shells of carbon atoms. The carbon atoms are rendered to a state excited with $2^+$ ion due to Auger effect caused by the exciation, so as to form atomic vacancies and interlattice atomic couples. The hydrogenated amorphous carbon is then annealed, and carbon atoms are rearranged to rotated triangular pattern. Thus, diamond good of crystallinity useful as a high-temperature semiconductor device, ultraviolet laser diode or protective film can be synthesized at a relatively low temperature and a low pressure. The process is applicable for the growth of a diamond single crystal thin film on a single crystal substrate such as amorphous carbon, silicon, or a Group III-V or II-VI compound semiconductor.

5 Claims, 4 Drawing Sheets local structure of hydrogenated amorphous carbon local structure of hydrogenated amorphous
carbon subjected to SOR irradiation local structure of annealed diamond single crystal

SYNTHESIS OF DIAMOND SINGLE CRYSTAL FROM HYDROGENATED AMORPHOUS CARBON

BACKGROUND OF THE INVENTION

The present invention relates to the synthesis of diamond single crystal expected to be used in various techincal fields such as a high-temperature semiconductor device, ultraviolet laser diode or transparent protective single crystal film excellent in hardness.

Synthetic diamond has been used as abrasive grains or cutting tools due to its high hardness, and as a heat sink for a laser element due to its excellent thermal conductivity. Since the diamond exhibits big band gap, it is expected to be used as a semiconductor ultraviolet laser or emitting source, too. Recently, the applicability of the diamond has been researched in the fields of optoelectronics, high-temperature semiconductor devices or the like suitable for high-speed data processing with high-density.

According to a conventional method, such synthetic diamond is produced by heating a mixture of graphite with a catalyst in a high-temperature diamond stable zone at a high pressure. The catalyst used in this method is a Group-VIII transition metal or its alloy having the function to melt the graphite in the diamond stable zone and to precipitate diamond particles having small solubility.

Synthetic diamond may be produced by synthesizing a quasi-diamond thin film on a substrate from the mixed gas of hydrocarbon with hydrogen or by photodissociating hydrogenated carbon gas to polycrystalline or nanocrystalline thin film.

Synthetic diamond obtained in any of the conventional methods contains impurities in fairly large amount, since it is inevitable to inhibit the inclusion of dissimilar components from the atmosphere. The product is of polycrystalline structure or nanocrystalline aggregate, too. Consequently, the obtained synthetic diamond does not satisfy the requirement necessary as the semiconductive or photosemiconductive material which must have crystallinity highly controlled.

SUMMARY OF THE INVENTION

The object of the present invention is to obtain diamond single crystal that is excellent in crystallinity by forming atomic vacancies and interllatice atomic couples which effectively induce the kinetic motion of interllatice atoms in hydrogenated amorphous carbon so as to rearrange carbon atoms to a rotated triangular pattern at a low temperature.

According to the present invention, hydrogenated amorphous carbon mainly composed of $sp^3$ structure is irradiated with X rays from emitted light to excite electrons on the 1s shells of carbon atoms. The carbon atom is rendered to the $2^+$ ion excited state due to Auger effect caused by the excitation, so as to form atomic vacancies and interlattice atoms in the hydrogenated amorphous carbon. The hydrogenated amorphous carbon is then annealed at a temperature sufficiently lower than its melting point. The annealing promotes the rearrangement of carbon atoms to a rotated triangular pattern only by the kinetic energy of the interlattice atoms.

The hydrogenated amorphous carbon mainly composed of $sp^3$ structure is prepared by adding hydrogen to carbon, decomposing hydrogenated carbon gas and rapidly cooling the decomposed gas on a substrate, or sputtering graphite with hydrogen atoms. The synthesis method is applicable to the growth of the thin film of diamond single crystal on a substrate such as amorphous carbon, silicon single crystal or Group III-V or II-VI compound semiconductor.

DETAILED DESCRIPTION OF THE PREFERRED EMBODIMENTS

Figure 1:
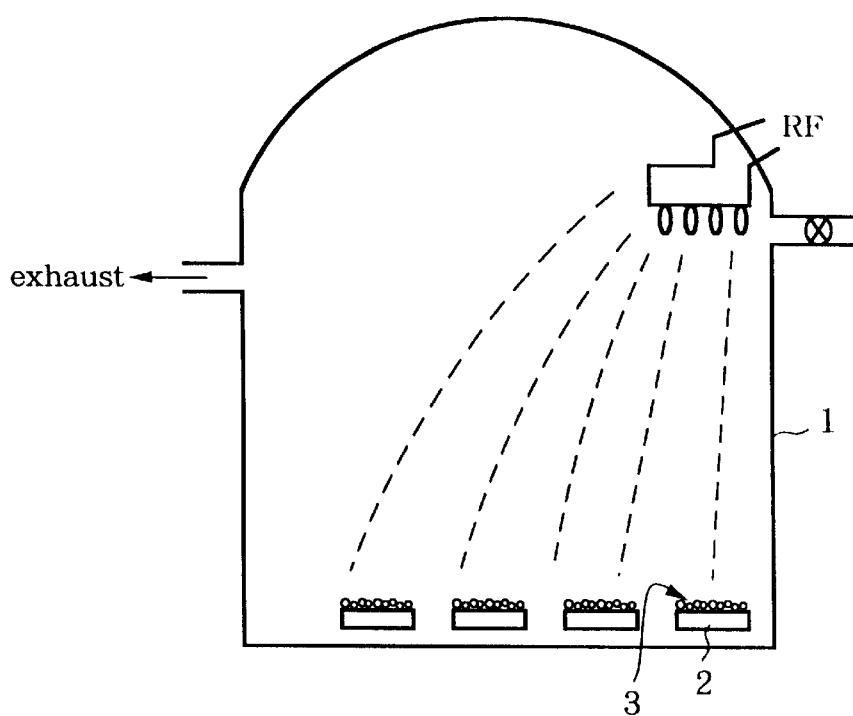
FIG. 1 is a schematic view illustrating a chamber for manufacturing hydrogenated amorphous carbon by decomposition with high-frequency plasma.

According to the present invention, carbon having $sp^2$ structure (graphite) is hydrogenated to amorphous carbon having $sp^3$ structure. The hydrogenation of carbon gas is performed by decomposing the mixed gas of 10–40 at. % hydrogen with 32 at. % benzene, 31 at. % cyclohexane, 28 at. % n-hexane, 30 at. % methane or 40 at. % propane by irradiation with an electromagnetic wave of radio frequency in a vacuum chamber. When the hydrogenated carbon gas is decomposed and precipitated on a semiconductor substrate held at 100°–350° C. in a sufficient hydrogen atmosphere, hydrogenated amorphous carbon mainly composed of $sp^3$ structure is formed.

When hydrogenated amorphous carbon is irradiated with X rays using emitted light, electrons on the 1s shells of carbon atoms are selectively excited so as to effectively render the carbon atoms to excited state due to the Auger effect. Since the 1s shell of a carbon atom is of 284 eV in energy level, monochromatic light (emitted light) at a higher energy level is used as an exciting source. Electrons are discharged to the vacuum atmosphere by the exciation of the 1s shell, 2p electrons are dropped from a valence electron band to the 1s shell so as to fill the resultant electron vacancies, and 2p electrons having momentum reversal to the energy are simultaneously discharged from the valence electron band to the vacuum atmosphere. As a result, carbon atoms in the state ionized to $2^+$ are excited.

Consequently, the movement of carbon atoms is induced with high density, and atomic vacancies and interlattice atomic couples are formed in the hydrogenated amorphous carbon. The atomic vacancy is the trace where carbon atom is discharged, and so lower of approximately 0.5 eV in kinetic energy with which adjacent carbon atom moves to the atomic vacancy that the movement of carbon atoms is promoted by low-temperature annealing at approximately 100°–250° C. The interlattice atom being coupled with the atomic vacancy is as the same lower level of approximately 0.5 eV as that of the atomic vacancy. As a result, the movement of interlattice atoms is facilitated by the low-temperature annealing.

The hydrogenated amorphous carbon in which the atomic vacancies and the interlattice atomic couples are formed has a four-coordinated structure. When this hydrogenated amorphous carbon is annealed at a relatively lower temperature, the movement of interlattice atoms at a lower energy level is efficiently induced by the atomic hole mechanism. In short, carbon atoms are rearranged to diamond structure only by the kinetic energy of the interlattice atoms, so as to obtain diamond single crystal excellent in crystallinity.

The atomic hole mechanism derived from the atomic vacancies and interlattice atomic couples is recognized by computer simulation according to the first principle molecular dynamic process. The process is the calculation method which enables to non-experientially determine the motion of atoms and the state of electrons according to quantum mechanics using atomic numbers as input paramators. The process is suitable for the analysis of reaction or dynamics in a complicated system.

Hydrogenated amorphous carbon is reacted with amorphous carbon in a computer according to the first priciple molecular dynamic process. The simulation reached the conclusions that the ratio of carbon having four-cordinated $sp^3$ structure in the hydrogenated amorphous carbon is increased to 80–90%, although three-cordinated $sp^2$ structure shears 80–90% of amorphous carbon. This result means that an amorphous state locally having structure and hardness similar to diamond is obtained. Two-cordinated dangling bonds and five-cordinated floating bonds are detected as faults in the hydrogenated amorphous carbon. Expecially in the case of the dangling bond, $sp^2$ and $sp^3$ structures are both degenerated, and there are two metastable states.

When atomic vacancies are formed by exciting the 1s shells of carbon atoms accompanying those faults, electrons are dropped from the 2p valence bands of carbon atoms toward the vacancies in the 1s shells, and 2p electrons at the same energy level but the reversal momentum are simultaneously discharged from the valence electron bands to the vacuum atmosphere. Carbon atoms excited to $2^+$ ion state exist for several picoseconds, during which carbon atoms accompanying the dangling bonds move in a long distance to form atomic vacancies and interlattice atomic couples.

As the result of the simulation test, the kinetic energy of interlattice atoms is of 0.5 eV smaller in one shift as compared with the atomic vacancy forming energy of 5 eV. Consequently, the hydrogenated amorphous carbon is mainly composed of four-cordinated structure, the movement of interlattice atoms at a relatively lower energy level is efficiently promoted by the relatively low-temperature annealing, and carbon atoms are rearraged to diamond structure only by the kinetic energy of the interlattice atoms.

EXAMPLE

Figure 2:
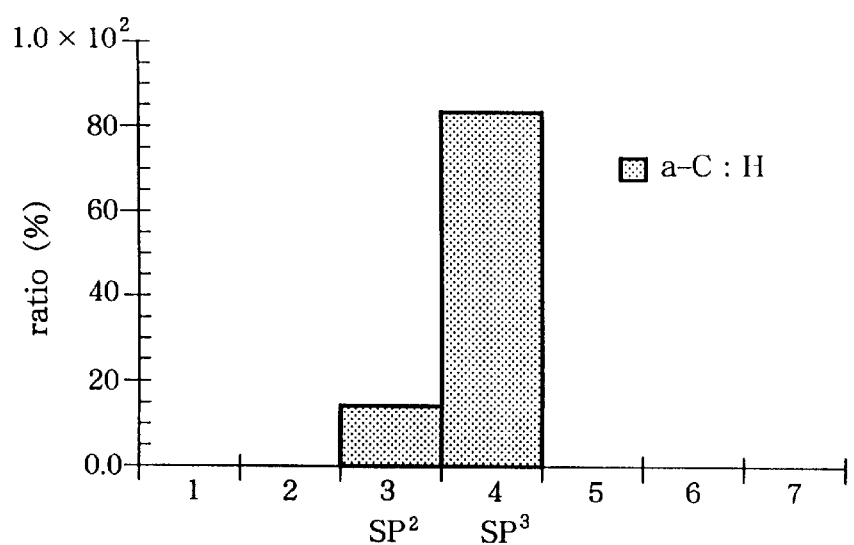
FIG. 2 is a graph showing the distribution of cordinations in hydrogenated amorphous carbon.

A semiconductor substrate was disposed as a target 2 in a vacuum chamber 1, as shown in FIG. 1. The chamber 1 was held at the vacuum degree of $10^{-4}$–$10^{-5}$ mmHg. Hydrogenated carbon was introduced into the chamber 1 and decomposed with high-frequency plasma. Hydrogenated amorphous carbon 3 was precipitated as the decomposition product on the semiconductor substrate 2. When the hydrogenated amorphous carbon was analyzed by Raman spectrum, four-cordinated structure generated by the hydrogenation was detected together with three-cordinated structure, as shown in FIG. 2.

Figure 3:
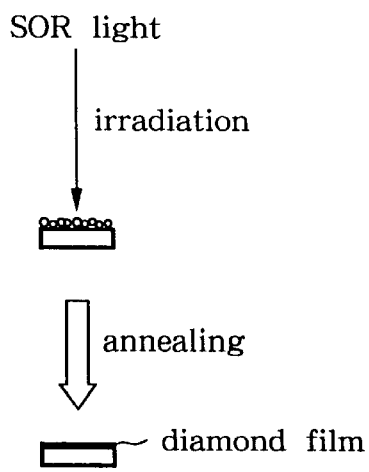
FIG. 3 is a schematic view for explaining the diamond synthesizing process according to the present invention.
Figure 4:
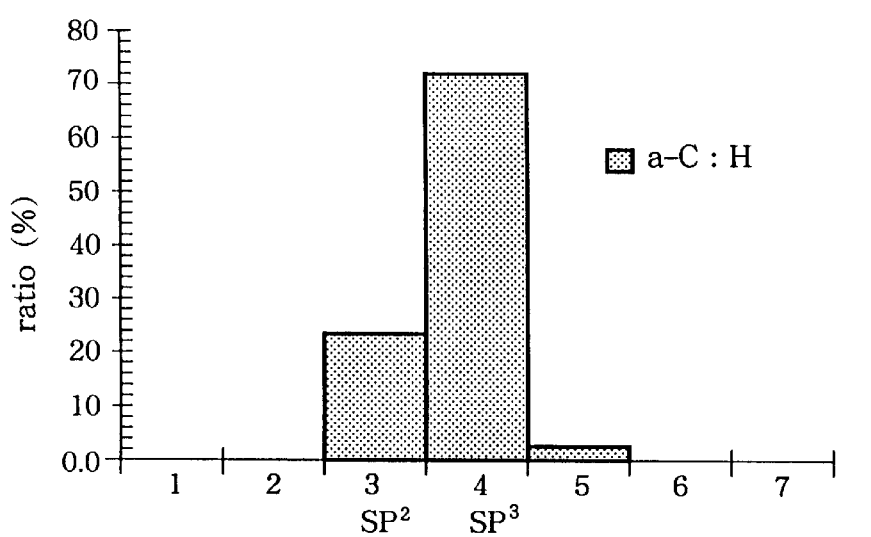
FIG. 4 is a graph showing the distribution of cordinations in electronically excited hydrogenated amorphous carbon.

The semiconductor substrate on which the hydrogenated amorphous carbon was deposited was then transferred to a synchrotron light emitting device. The interior of the device was held at the high vacuum degree of $10^{-11}$ mm Hg at an ordinary temperature, and the hydrogenated amorphous carbon was excited by irradiation with synchrotron orbital radiation light, as shown in FIG. 3. The Raman spectrum analysis of the hydrogenated amorphous carbon after being excited is shown in FIG. 4. It is noted from FIG. 4 that the ratio of carbon atoms having $sp^2$ structure was increased due to the formation of atomic vacancies.

Figure 5:
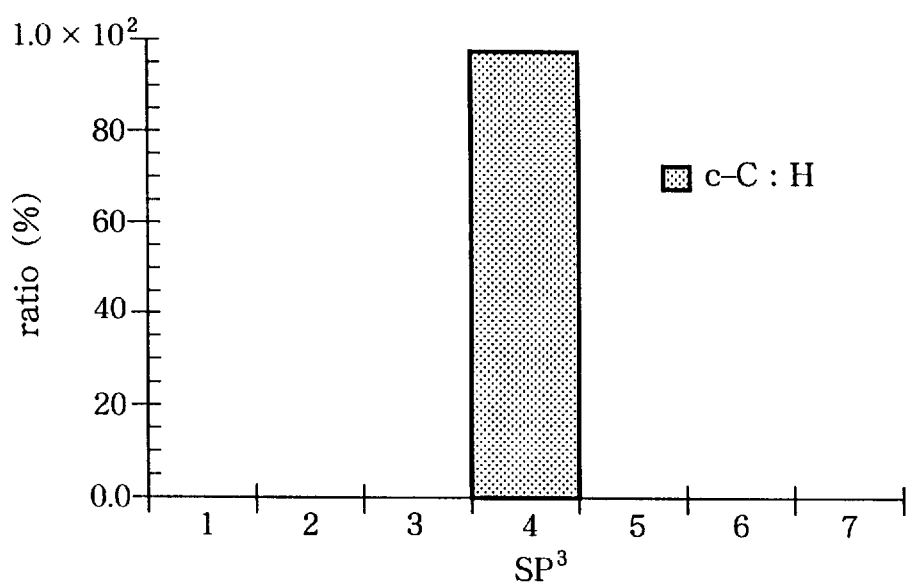
FIG. 5 is a graph showing the distribution of cordinations in an annealed diamond thin film.

After the exciting treatment, the hydrogenated amorphous carbon was annealed at a relatively low temperature of 300° C., to obtain a diamond thin film. The Raman spectrum analysis of the obtained diamond thin film is shown in FIG. 5. It is noted from FIG. 5 that the deposit was converted to diamond consisting of $sp^3$ structure only. The result suggests that the annealing facilitated the movement of atoms through atomic vacancies so as to convert the deposit to a single crystal state, i.e. diamond.

Figure 6:
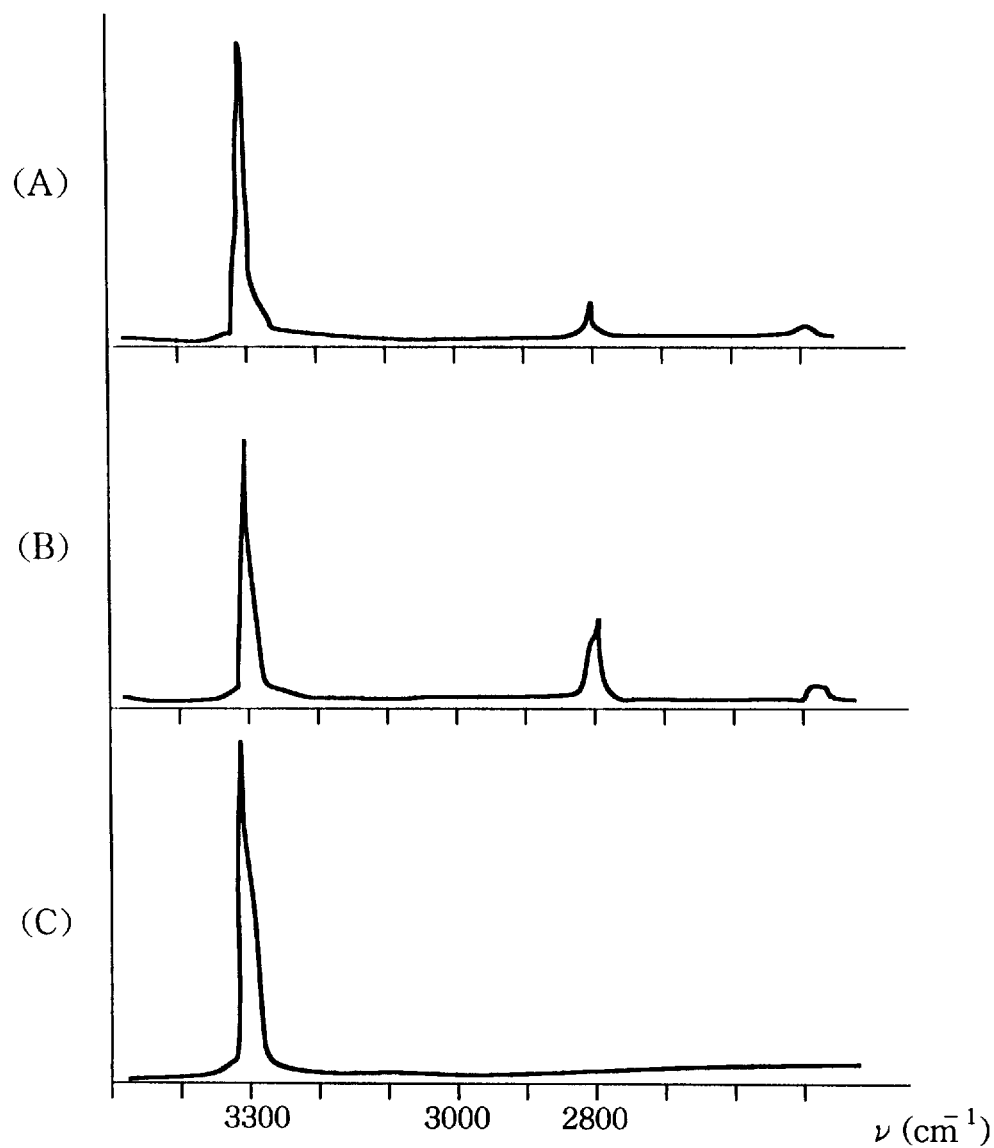
FIG. 6 is a spectal atlas showing Raman spectrum (A) of hydrogenated amorphous carbon, Raman spectrum (B) of electronically excited hydrogenated amorphous carbon and Raman spectrum (C) of a diamond thin film obtained in the example.

The conversion from hydrogenated amorphous carbon to diamond is noted from the Raman spectrum shown in FIG. 6, too. That is, the Raman spectrum of the hydrogenated amorphous carbon has two peaks, one of which is at 2800 $cm^{-1}$ originated in $sp^2$ structure and the other of which is at 3300 $cm^{-1}$ originated in four-cordinated $sp^3$ structure, as shown by the curve (A) in FIG. 6. Raman spectrum after the exciting treatment is shown by the curve (B), wherein the peak of 2800 $cm^{-1}$ was higher a little bit, but the curve (B) is not substantially deviated from the curve (A). On the other hand, after the excited hydrogenated amorpous carbon was annealed, only the peak of 3300 $cm^{-1}$ was detected, but the peak of 2800 $cm^{-1}$ was diminished as shown by the curve (C). As a result, it is confirmed that the obtained thin film was composed of diamond having four-cordinated $sp^3$ structure.

According to the present invention as aforementioned, atomic vacancies and interlattice atomic couples are formed in hydrogenated amorphous carbon by irradiation with X rays, and the movement of interlattice atoms at a lower energy level is efficiently induced by atomic hole mechanism so as to rearrange atoms in the hydrogenated amorphous carbon to diamond single crystal. Consequently, diamond excellent in crystallinity is synthesized at a relatively lower temperature and a lower pressure. The obtained diamond or diamond thin film is useful as the high-functional material, e.g. semiconductor device, ultraviolet laser diode or transparent single crystal film, which may be reformed to type-n or type-p by proper doping treatment. Especially, the use as a high-temperature device is expected, since the diamond is stable at a high temperature.

What is claimed is;:

1. A method of synthesizing diamond single crystal from hydrogenated amorphous carbon, comprising the steps of:

preparing hydrogenated amorphous carbon substantially comprising an $sp^3$ structure;

irradiating said hydrogenated amorphous carbon with X rays to form atomic vacancies and interlattice atomic couples; and annealing said hydrogenated amorphous carbon to rearrange carbon atoms to a rotated triangular pattern.

2. The method defined by claim 1, including preparing the hydrogenated amorphous carbon by decomposing and rapidly cooling hydrogenated carbon gas on a substrate.

3. The method defined by claim 1, including Preparing the hydrogenated amorphous carbon by sputtering graphite with hydrogen atoms.

4. The method defined by claim 1, including annealing the irradiated hydrogenated amorphous carbon at a temperature lower than its melting point.

5. The method defined by claim 1, including growing the synthesized diamond as a thin film on a substrate selected from the group consisting of amorphous carbon, silicon and Group III-V or II-VI compound semiconductor.

* * * * *

UNITED STATES PATENT AND TRADEMARK OFFICE
CERTIFICATE OF CORRECTION

PATENT NO. : 5,891,241
DATED : April 6, 1999
INVENTOR(S) : Hiroshi Yoshida

Page 1 of 2

It is certified that error appears in the above-identified patent and that said Letters Patent is hereby corrected as shown below:

Title Page, [57] ABSTRACT, Line 8, "exciation" should read --excitation--.

Column 1 Line 7 "techincal" should read --technical--.

Column 1 Line 45 "interllatice" should read --interlattice--.

Column 1 Line 46 "interllatice" should read --interlattice--.

Column 2 Line 6, "cordinations" should read --coordinations--.

Column 2 Line 10, "cordinations" should read --coordinations--.

Column 2 Line 12 "cordinations" should read --coordinations--.

Column 2 Line 14 "spectal" should read --spectral--.

Column 2 Line 34 "Is shells" should read --1s shells--.

Column 2 Line 40 "exciation" should read --excitation--.

Column 3 Line 7 "paramators" should read --parameters--.

Column 3 Line 11 "priciple" should read --principle--.

Column 3 Line 13 "four-cordinated" should read --four-coordinated--.

Column 3 Line 15 "three-cordinated" should read --three-coordinated--.

Column 3 Line 18 "Two-cordinated" should read --Two-coordinated--.

Column 3 Line 19 "five-cordinated" should read --five-coordinated--.

UNITED STATES PATENT AND TRADEMARK OFFICE
CERTIFICATE OF CORRECTION

PATENT NO. : 5,891,241
DATED : April 6, 1999
INVENTOR(S) : Hiroshi Yoshida

It is certified that error appears in the above-identified patent and that said Letters Patent is hereby corrected as shown below:

Column 3 Line 19 "Expecially" should read --Especially--.

Column 3 Line 36 "four-cordinated" should read --four-coordinated--.

Column 3 Line 39 "rearraged" should read --rearranged--.

Column 3 Line 51 "four-cordinated" should read --four-coordinated--.

Column 3 Line 52 "three-cordinated" should read --three-coordinated--.

Column 4 Line 15 "four-cordinated" should read --four-coordinated--.

Column 4 Line 20 "amorpous" should read --amorphous--.

Column 4 Line 24 "four-cordinated" should read --four-coordinated--.

Column 4 Line 53 Claim 3 "including Preparing" should read --including preparing--.

Signed and Sealed this

Sixteenth Day of November, 1999

Attest:

Q. TODD DICKINSON

Attesting Officer

Acting Commissioner of Patents and Trademarks